United States Patent [19]

Moxon et al.

[11] Patent Number: 4,582,309

[45] Date of Patent: Apr. 15, 1986

[54] JIGS FOR LOCATING ELECTRICAL COMPONENTS

[75] Inventors: Michael Moxon, Mansfield; Thomas E. Aram, Nottingham, both of England

[73] Assignee: Plessey Overseas Limited, Ilford, England

[21] Appl. No.: 641,680

[22] Filed: Aug. 17, 1984

[30] Foreign Application Priority Data

Aug. 18, 1983 [GB] United Kingdom ............... 8322229

[51] Int. Cl.$^4$ .............................................. B23Q 3/00
[52] U.S. Cl. ..................................... 269/303; 269/903
[58] Field of Search ................... 269/303, 903, 289 R, 269/296

[56] References Cited

U.S. PATENT DOCUMENTS

| 3,680,193 | 8/1972 | Scaminanci, Jr. et al. | 269/903 |
| 4,128,235 | 12/1978 | Gersbacher | 269/303 |
| 4,404,741 | 9/1983 | Lebet et al. | 29/721 |
| 4,437,718 | 3/1984 | Selinko | 339/61 M |

FOREIGN PATENT DOCUMENTS

| 0400580 | 11/1981 | European Pat. Off. . |
| 2048381 | 4/1972 | Fed. Rep. of Germany . |
| 2258701 | 4/1974 | Fed. Rep. of Germany . |
| 2740303 | 3/1978 | Fed. Rep. of Germany . |
| 1361126 | 7/1974 | United Kingdom . |
| 1539840 | 2/1979 | United Kingdom . |

Primary Examiner—Frederick R. Schmidt
Assistant Examiner—Judy J. Hartman
Attorney, Agent, or Firm—Fleit, Jacobson, Cohn & Price

[57] ABSTRACT

A tool for accurately positioning a flat pack multi-lead component to a PCB during soldering of the leads. The tool has a double function in providing both an accurate location for the board and the component while re-flow soldering takes place. It also provides fool-proof orientation of the component. The basis of the tool is four locating pins which locate at the corners of a square flat pack component but each pin is accurately made and positioned to locate the end leads of the two adjacent sides with a small clearance from the moulded body itself. This takes account of variations in the moulded bodies. One corner of the square body is chamfered and one of the pins is similarly shaped to ensure correct orientation.

5 Claims, 10 Drawing Figures

JIGS FOR LOCATING ELECTRICAL COMPONENTS

BACKGROUND

This invention relates to jigs for locating electrical components and more particularly to jigs for locating flat pack multi-lead components on a mounting surface during the lead soldering operations.

A flat pack multi-lead component usually comprises a square or rectangular planar body with a plurality of leads extending perpendicularly from each edge of the body. These leads are spaced very close together, for example at intervals of less than 1 mm, and thus very accurate location of the component is required on the mounting surface, which is provided with mating electrical conductors, so that the leads align with the conductors before they are soldered together. The mounting surface normally consists of a printed circuit board.

OBJECTS AND SUMMARY OF THE INVENTION

It is an object of the present invention therefore to provide a jig for easily locating such components on mounting surfaces and accurately aligning them relative to each other.

According to the present invention a jig, for locating a flat pack multi-lead component having a multi-edged body with leads extending perpendicularly from at least two of the edges on a mounting surface having mating electrical conductors, comprises a base member with a plurality of locating pins projecting perpendicularly from the base member, the locating pins being adapted to pass through orifices formed in the mounting surface so that the mounting surface is located in a predetermined position on the base member, the locating pins being positioned so that the ends of the at least two edges of the body having the extending leads are adjacent thereto when the component is placed on the mounting surface whereby the locating pins position the component by contacting the end leads only of the leads extending from the at least two edges.

Thus the flat pack multi-lead component may have a triangular shaped body with leads extending from two or three of the edges of the body. In this case three locating pins are provided, one adjacent to each corner of the body, one or more of the locating pins contacting two adjacent end leads. Similarly, for square or rectangular shaped bodies having either two, three or four edges with extending leads, four locating pins may be provided, one adjacent to each corner of the body, one or more of the locating pins contacting two adjacent end leads.

In the case of a polygonal body, for example, a hexagonal or octagonal shaped body, locating pins may be positioned to contact the end leads only extending from those edges having extending leads. Only when every side of a hexagonal or octagonal shaped body has extending leads a locating pin may be required adjacent to each corner of the body, each locating pin contacting two end leads.

BRIEF DESCRIPTION OF THE DRAWINGS

An embodiment of the invention will now be described by way of example with reference to the accompanying drawings in which.

DETAILED DESCRIPTION

It has been found that certain electrical components such as a flat pack multi-lead component having leads spaced very close together, for example, at intervals of less than 1 mm is very difficult to align with conductors on a printed circuit board since the plastics body of the component is not necessarily very accurately formed. The leads are accurately positioned and in the present invention therefore the leads are used to locate the component.

Figure 1:
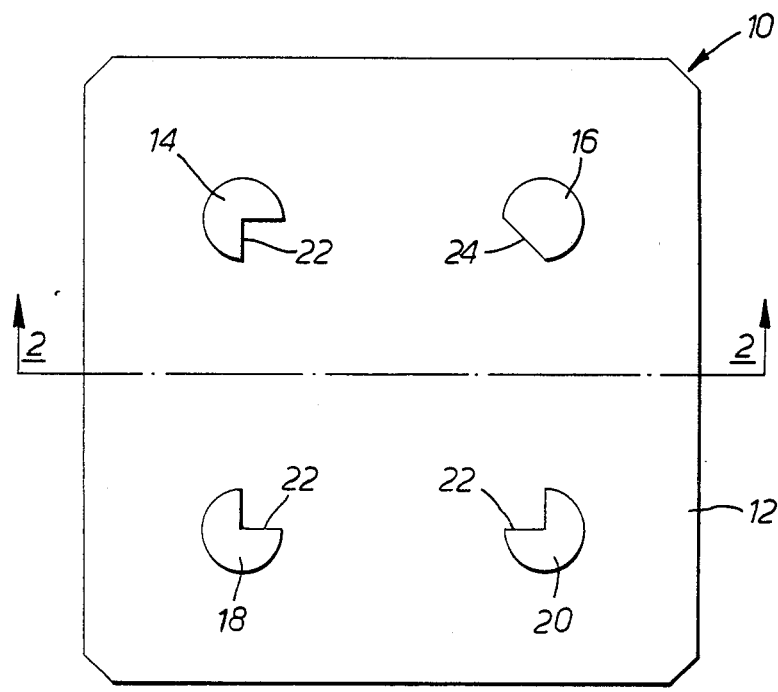
FIGS. 1 and 2 are plan and cross-sectional views of a jig for locating electrical components according to the invention.
Figure 2:
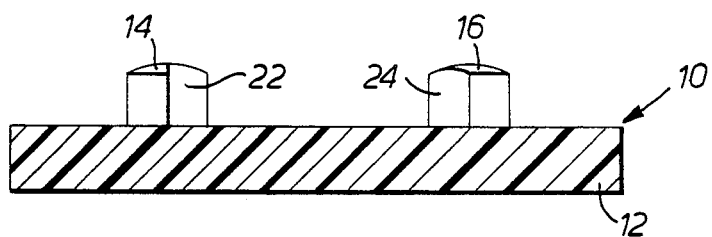

The jig 10 (FIGS. 1 and 2) consists of a base 12 with four accurately positioned locating pins 14, 16, 18 and 20 extending perpendicularly therefrom. The pins 14, 18 and 20 each have a quadrant shaped cut-away portion 22 extending along the whole length of the pin whilst the pin 16 has a cut-away segment 24 extending along its length.

Figure 3:
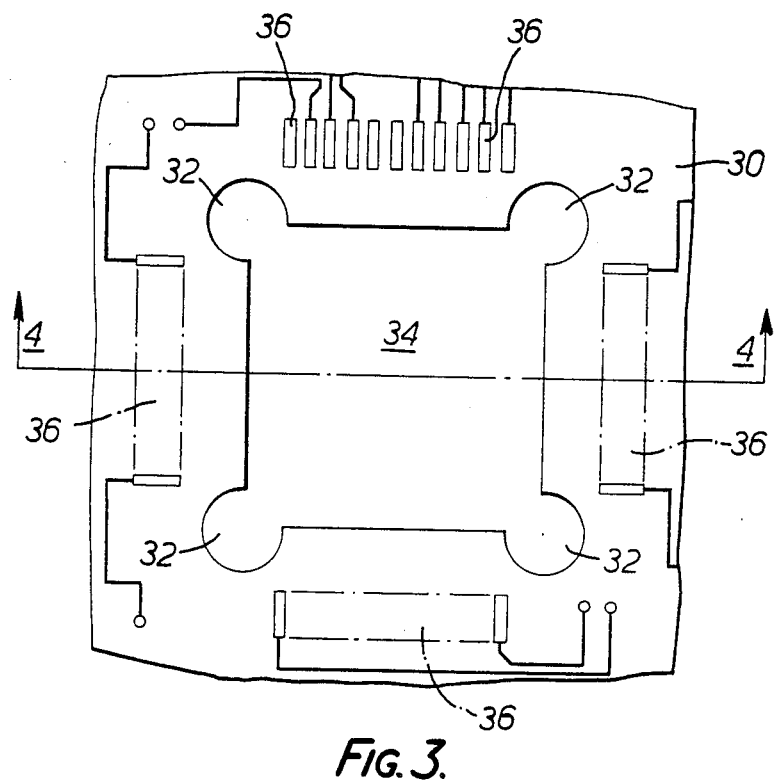
FIGS. 3 and 4 are plan and cross-sectional views of a portion of a printed circuit board on which an electrical component is to be mounted.
Figure 4:

The printed circuit board, only a portion 30 of which is illustrated in FIGS. 3 and 4 has four accurately formed holes 32 and a square hole 34 formed therethrough, the square hole 34 intersecting the four holes 32 at its corners. Conductors 36 are formed on the P.C.B. adjacent to each side of the hole 34.

Figure 5:
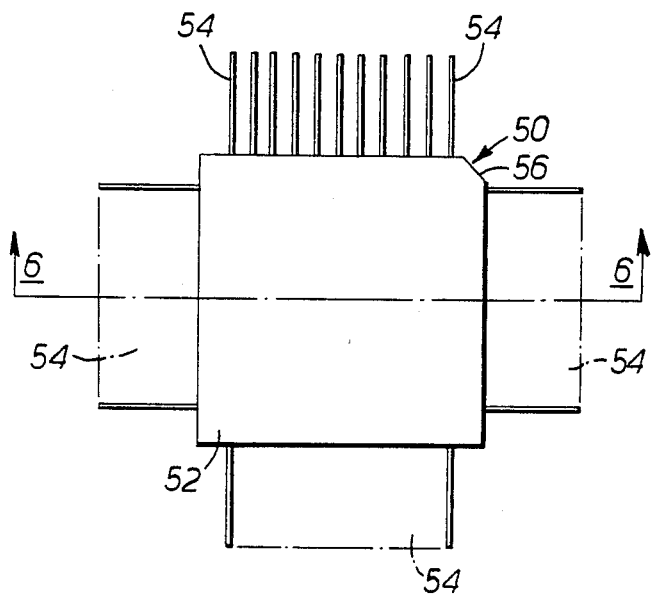
FIGS. 5 and 6 are plan and cross-sectional views of an electrical component for mounting on the printed circuit board shown in FIGS. 3 and 4.
Figure 6:
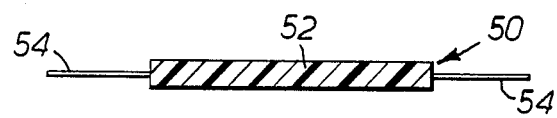
Figure 7:
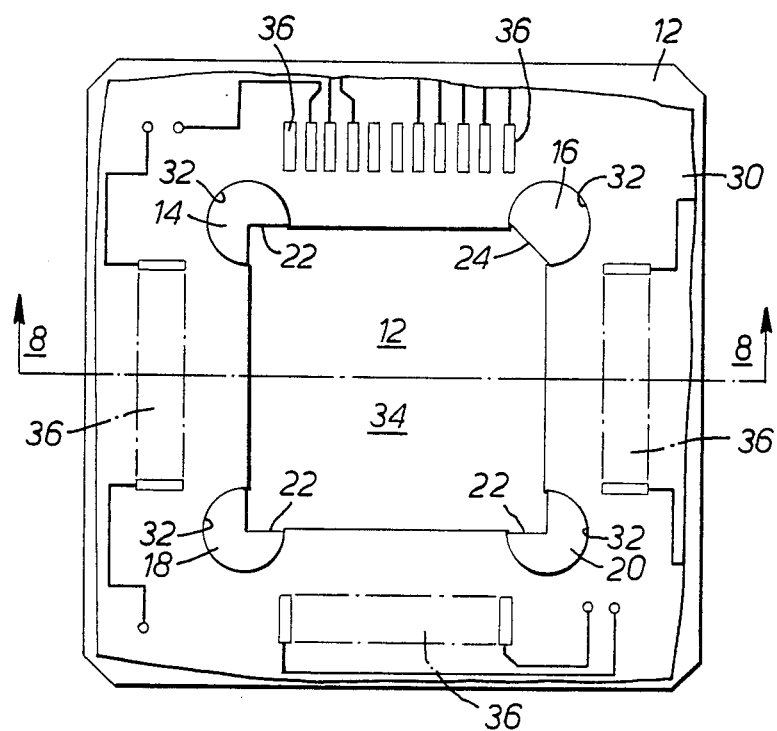
FIGS. 7 and 8 are plan and cross-sectional views of the jig with the printed circuit board mounted thereon and, FIGS. 9 and 10 are plan and cross-sectional views of the jig with the printed circuit board and the electrical component mounted thereon.
Figure 8:
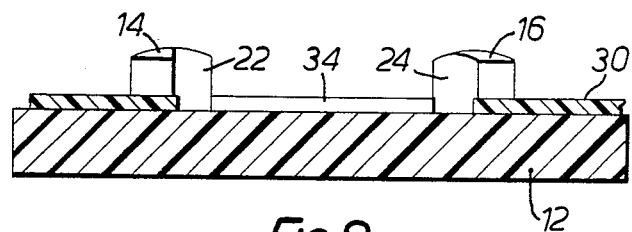
Figure 9:
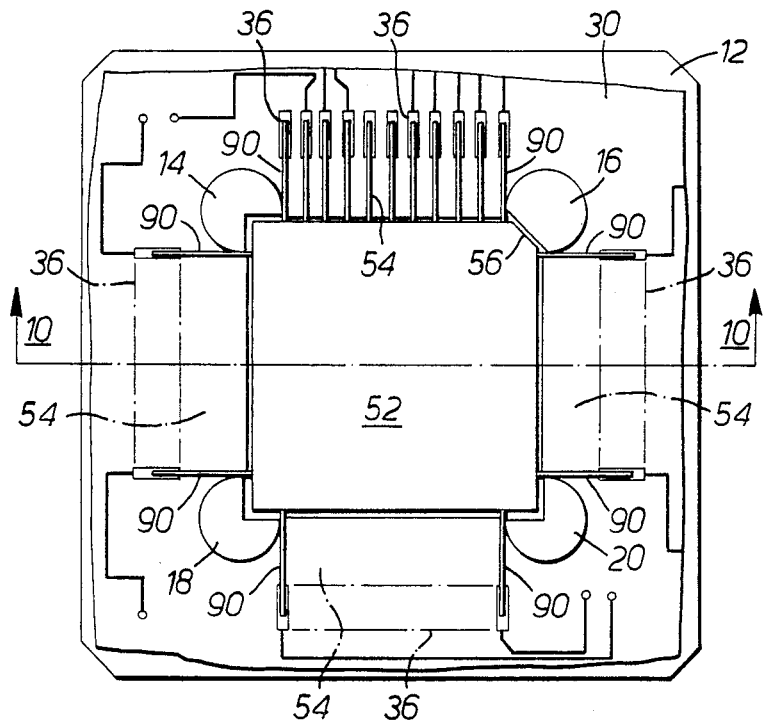
Figure 10:
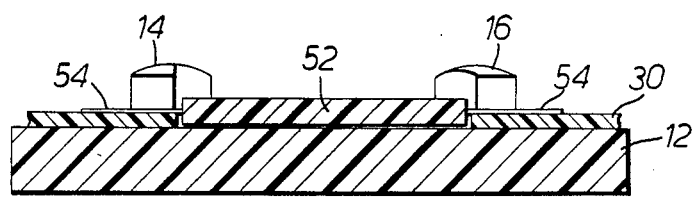

The flat pack multi-lead component 50 (FIGS. 5 and 6) consists of a square shaped plastics body 52 with a plurality of leads 54 extending from each of its four edges. One of the corners 56 of the body 52 is chamfered off and one of the sides of the body 52 has suitable markings to indicate the correct mounting position of the component 50.

The method of mounting the component 50 on the P.C.B. 30 is illustrated in FIGS. 7 to 10.

The P.C.B. 30 is fitted on to the jig with the accurately formed holes 32 fitting over the pins 14, 16, 18 and 20. The P.C.B. 30 then rests on the base 12 of the jig. (The jig would normally be large enough to support the whole P.C.B. but is shown relatively small in the figures for clarity). The component 50 is then placed over the hole 34 in the P.C.B. and it will be noted that there is a small clearance between the sides of the hole 34 and the edges of the body 52. (See FIG. 9.) The component 50 can also only be fitted in one position with the chamfered corner 56 adjacent to the pin 16 with the cut-away segment 24 and the pins 14, 18 and 20 adjacent to the other three corners.

The component 50 is located by the two outer end leads 90 extending from adjacent edges of the body 52 touching one of the pins 14, 16, 18 and 20. The pins accurately locate the leads 54 in alignment with the conductors 36.

The four holes 32 in the P.C.B. are drilled or pierced with the same accurately as other component mounting holes, whilst the hole 34 can be punched as less accuracy is needed since it forms a clearance hole only for the body 52 of the component 50.

Once the component 50 is aligned by this method on the P.C.B. and the jig the leads and conductors are soldered in a reflow soldering machine.

Whilst a square flat pack multi-lead component location system has only been described, the method is suitable for various other shaped flat pack components. For example a triangular shaped component with leads extending from two or three edges would require a jig with only 3 pins, again one adjacent each corner. A square or rectangular component with leads extending from only two or three edges could still be located on the jig described; in this case only one lead would contact some of the pins. Similarly polygonal shaped components such as hexagonal and octagonal could be located either using a pin adjacent to each corner i.e. six or eight pins, or only four suitably positioned pins adjacent to four corners could be used. The essential feature for multi-sided components having leads extending from only two or more edges is that a pin must be located to touch the outer lead of each of the edges with the extending leads.

I claim:

1. A jig for locating a flat pack multi-lead component having a multi-edged body with leads extending perpendicularly from at least two of the edges on a mounting surface having mating electrical conductors comprising a base member with a plurality of shaped locating pins projecting perpendicularly from said base member, said locating pins being adapted to pass through orifices formed in the mounting surface so that said mounting surface is located in a predetermined position on said base member, said locating pins being positioned so that the intersection of said at least two edges of the body having the extending leads abut a mutually shaped portion of at least one locating pin when said component is placed on said mounting surface whereby said locating pins position said component by contacting the end leads only of the leads extending from said at least two edges to connectors on said mounting surface.

2. A jig as claimed in claim 1 in which said flat pack multi-lead component has a square shaped body with leads extending from at least two edges.

3. A jig as claimed in claim 2 in which four locating pins are provided, each positioned to be adjacent to each corner of the body, at least one of the locating pins contacting two adjacent end leads.

4. A jig as claimed in claim 1 in which said flat pack multi-lead component has a rectangular shaped body with leads extending from at least two edges.

5. A jig as claimed in claim 4 in which four locating pins are provided, each positioned to be adjacent to each corner of the body, at least one of the locating pins contacting two adjacent end leads.

* * * * *